(12) United States Patent
Hsu et al.

(10) Patent No.: US 11,054,750 B2
(45) Date of Patent: Jul. 6, 2021

(54) PROFILE AWARE SOURCE-MASK OPTIMIZATION

(71) Applicant: ASML Netherlands B.V., Veldhoven (NL)

(72) Inventors: Duan-Fu Stephen Hsu, Fremont, CA (US); Rafael C. Howell, Santa Clara, CA (US); Feng-Liang Liu, Shenzhen (CN)

(73) Assignee: ASML Netherlands B.V., Veldhoven (NL)

(*) Notice: Subject to any disclaimer, the term of this patent is extended or adjusted under 35 U.S.C. 154(b) by 300 days.

(21) Appl. No.: 15/023,330

(22) PCT Filed: Sep. 11, 2014

(86) PCT No.: PCT/EP2014/069396
§ 371 (c)(1),
(2) Date: Mar. 18, 2016

(87) PCT Pub. No.: WO2015/049099
PCT Pub. Date: Apr. 9, 2015

(65) Prior Publication Data
US 2016/0231654 A1    Aug. 11, 2016

Related U.S. Application Data

(60) Provisional application No. 61/885,301, filed on Oct. 1, 2013.

(51) Int. Cl.
*G03F 7/20* (2006.01)

(52) U.S. Cl.
CPC .......... *G03F 7/70483* (2013.01); *G03F 7/705* (2013.01); *G03F 7/70125* (2013.01); *G03F 7/70433* (2013.01)

(58) Field of Classification Search
CPC .. G03F 7/70483; G03F 7/705; G03F 7/70625; G03F 1/70; G03F 7/70125;
(Continued)

(56) References Cited

U.S. PATENT DOCUMENTS

| 5,229,872 A | 7/1993 | Mumola |
| 5,296,891 A | 3/1994 | Vogt et al. |

(Continued)

FOREIGN PATENT DOCUMENTS

| WO | 2010/059954 | 5/2010 |

OTHER PUBLICATIONS

International Search Report and Written Opinion dated Oct. 31, 2014 in corresponding International Patent Application No. PCT/EP2014/069396.

(Continued)

*Primary Examiner* — Mesfin T Asfaw
(74) *Attorney, Agent, or Firm* — Pillsbury Winthrop Shaw Pittman LLP

(57) ABSTRACT

A method to improve a lithographic process for imaging a portion of a design layout onto a substrate using a lithographic projection apparatus having an illuminator and projection optics, the method including: computing a multi-variable cost function of a plurality of design variables that are characteristics of the lithographic process, at least some of the design variables being characteristics of the illumination produced by the illuminator and of the design layout, wherein the multi-variable cost function is a function of a three-dimensional resist profile on the substrate, or a three-dimensional radiation field projected from the projection optics, or both; and reconfiguring one or more characteristics of the lithographic process by adjusting the design variables until a predefined termination condition is satisfied.

20 Claims, 14 Drawing Sheets

(58) Field of Classification Search
CPC .... G03F 7/70516; G03F 7/70616; G03F 1/36; G03F 7/70508; G03F 7/70091; G03F 7/70283; G03F 1/38; G03F 7/0002; G03F 7/70558; G03F 1/26; G03F 1/72; G03F 7/70075; G03F 9/7019; G03F 7/70433; G03F 7/70258; G03F 7/70275; H01L 21/0274

See application file for complete search history.

(56) References Cited

U.S. PATENT DOCUMENTS

| | | | |
|---|---|---|---|
| 5,523,193 | A | 6/1996 | Nelson |
| 6,046,792 | A | 4/2000 | Van Der Werf et al. |
| 7,003,758 | B2 | 2/2006 | Ye et al. |
| 7,587,704 | B2 | 9/2009 | Ye et al. |
| 8,200,468 | B2 | 6/2012 | Ye et al. |
| 8,356,261 | B1 | 1/2013 | Socha |
| 8,438,508 | B2 | 5/2013 | Liu |
| 8,786,824 | B2 | 7/2014 | Hansen |
| 9,235,662 | B2 | 1/2016 | Liu |
| 2010/0251202 | A1 | 9/2010 | Pierrat |
| 2010/0315614 | A1 | 12/2010 | Hansen |
| 2011/0185324 | A1 | 7/2011 | Huang et al. |
| 2012/0185807 | A1 | 7/2012 | Tsai et al. |
| 2013/0000505 | A1* | 1/2013 | Tao ............ G03F 7/70441 101/450.1 |
| 2013/0204594 | A1 | 8/2013 | Liu |
| 2013/0254724 | A1 | 9/2013 | Parikh |

OTHER PUBLICATIONS

Chris Spence, "Full-Chip Lithography Simulation and Design Analysis—How OPC Is Changing IC Design," Proc. SPIE, vol. 5751, pp. 1-14 (2005).

Yu Cao et al., "Optimized Hardware and Software for Fast, Full Chip Simulation," Proc. SPIE, vol. 5754, pp. 407-414 (2005).

Alan E. Rosenbluth et al., "Optimum mask and source patterns to print a given shape," J. Microlith., Microfab., Microsyst, vol. 1, No. 1, pp. 13-30 (Apr. 2002).

Yuri Granik, "Source optimization for image fidelity and throughput," J. Microlith., Microfab., Microsyst, vol. 3, No. 4, pp. 509-522 (Oct. 2004).

Robert Socha et al., "Simultaneous Source Mask Optimization (SMO)," Proc. of SPIE, vol. 5853, pp. 180-193 (2005).

Ao Chen et al., "Resist Profile Aware Source Mask Optimization," Proc. of SPIE, vol. 9053, pp. 90530X-1-90530X-10 (Mar. 28, 2014).

Thomas Mülders et al., "Source-mask optimization incorporating a physical resist model and manufacturability constraints," Proc. of SPIE, vol. 8326, pp. 83260G-1-83260G-13 (Feb. 21, 2012).

Taiwan Office Action dated May 25, 2016 in corresponding Taiwan Patent Application No. 103133629.

* cited by examiner

PROFILE AWARE SOURCE-MASK OPTIMIZATION

CROSS-REFERENCE TO RELATED APPLICATIONS

This application is the U.S. national phase entry of PCT patent application no. PCT/EP2014/069396, which was filed on Sep. 11, 2014, which claims the benefit of priority of U.S. provisional application No. 61/885,301, which was filed on Oct. 1, 2013, and which is incorporated herein in its entirety by reference.

TECHNICAL FIELD

The description herein relates to lithographic apparatuses and processes, and more particularly to a method or tool for optimization of an illumination source and/or patterning device/design layout for use in a lithographic apparatus or process.

BACKGROUND

A lithographic projection apparatus can be used, for example, in the manufacture of integrated circuits (ICs). In such a case, a patterning device (e.g., a mask) may contain or provide a circuit pattern corresponding to an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithographic projection apparatus, one target portion at a time. In one type of lithographic projection apparatuses, the circuit pattern on the entire patterning device is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithographic projection apparatus will have a magnification factor M (generally <1), the speed F at which the substrate is moved will be a factor M times that at which the projection beam scans the patterning device. More information with regard to lithographic devices as described herein can be gleaned, for example, from U.S. Pat. No. 6,046,792, incorporated herein by reference.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, microlithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula CD=$k_1 \times \lambda$/NA, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic projection apparatus and/or design layout. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

As an example, OPC addresses the fact that the final size and placement of an image of the design layout projected on the substrate will not be identical to, or simply depend only on the size and placement of the design layout on the patterning device. It is noted that the terms "mask", "reticle", "patterning device" are utilized interchangeably herein. Also, person skilled in the art will recognize that, especially in the context of lithography simulation/optimization, the term "mask"/"patterning device" and "design layout" can be used interchangeably, as in lithography simulation/optimization, a physical patterning device is not necessarily used but a design layout can be used to represent a physical patterning device. For the small feature sizes and high feature densities present on some design layout, the position of a particular edge of a given feature will be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during post-exposure bake (PEB), resist development, and etching that generally follow lithography.

In order to ensure that the projected image of the design layout is in accordance with requirements of a given target circuit design, proximity effects need to be predicted and compensated for, using sophisticated numerical models, corrections or pre-distortions of the design layout. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the design layout has some modification in order to achieve high fidelity of the projected image to the target design. These modifications may include shifting or biasing of edge positions or line widths as well as application of "assist" features that are intended to assist projection of other features.

Application of model-based OPC to a target design involves good process models and considerable computational resources, given the many millions of features typically present in a chip design. However, applying OPC is generally not an "exact science", but an empirical, iterative process that does not always compensate for all possible proximity effect. Therefore, effect of OPC, e.g., design layouts after application of OPC and any other RET, need to be verified by design inspection, i.e. intensive full-chip simulation using calibrated numerical process models, in order to minimize the possibility of design flaws being built into the patterning device pattern. This is driven by the enormous cost of making high-end patterning devices, which run in the multi-million dollar range, as well as by the impact on turn-around time by reworking or repairing actual patterning devices once they have been manufactured.

Both OPC and full-chip RET verification may be based on numerical modeling systems and methods as described, for example in, U.S. patent application Ser. No. 10/815,573 and an article titled "Optimized Hardware and Software For Fast, Full Chip Simulation", by Y. Cao et al., Proc. SPIE, Vol. 5754, 405 (2005).

One RET is related to adjustment of the global bias of the design layout. The global bias is the difference between the patterns in the design layout and the patterns intended to print on the substrate. For example, a circular pattern of 25 nm diameter may be printed on the substrate by a 50 nm diameter pattern in the design layout or by a 20 nm diameter pattern in the design layout but with high dose.

In addition to optimization to design layouts or patterning devices (e.g., OPC), the illumination source can also be optimized, either jointly with patterning device optimization or separately, in an effort to improve the overall lithography fidelity. The terms "illumination source" and "source" are used interchangeably in this document. Since the 1990s, many off-axis illumination sources, such as annular, quadrupole, and dipole, have been introduced, and have provided more freedom for OPC design, thereby improving the imaging results, As is known, off-axis illumination is a proven way to resolve fine structures (i.e., target features) contained in the patterning device. However, when compared to a traditional illumination source, an off-axis illumination source usually provides less radiation intensity for the aerial image (AI). Thus, it becomes desirable to attempt to optimize the illumination source to achieve the optimal balance between finer resolution and reduced radiation intensity.

Numerous illumination source optimization approaches can be found, for example, in an article by Rosenbluth et al., titled "Optimum Mask and Source Patterns to Print A Given Shape", Journal of Microlithography, Microfabrication, Microsystems 1(1), pp. 13-20, (2002). The source is partitioned into several regions, each of which corresponds to a certain region of the pupil spectrum. Then, the source distribution is assumed to be uniform in each source region and the brightness of each region is optimized for process window. However, such an assumption that the source distribution is uniform in each source region is not always valid, and as a result the effectiveness of this approach suffers. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations. Though these methods have demonstrated some successes, they typically require multiple complicated iterations to converge. In addition, it may be difficult to determine the appropriate/optimal values for some extra parameters, such as y in Granik's method, which dictates the trade-off between optimizing the source for substrate image fidelity and the smoothness requirement of the source.

For low $k_1$ photolithography, optimization of both the source and patterning device is useful to ensure a viable process window for projection of critical circuit patterns. Some algorithms (e.g. Socha et. al. Proc. SPIE vol. 5853, 2005, p. 180) discretize illumination into independent source points and mask into diffraction orders in the spatial frequency domain, and separately formulate a cost function (which is defined as a function of selected design variables) based on process window metrics such as exposure latitude which could be predicted by optical imaging models from source point intensities and patterning device diffraction orders. The term "design variables" as used herein comprises a set of parameters of a lithographic projection apparatus, for example, parameters a user of the lithographic projection apparatus can adjust. It should be appreciated that any characteristics of a lithographic projection process, including those of the source, the patterning device, the projection optics, and/or resist characteristics can be among the design variables in the optimization. The cost function is often a non-linear function of the design variables. Then standard optimization techniques are used to minimize the cost function.

Relatedly, the pressure of ever decreasing design rules have driven semiconductor chipmakers to move deeper into the low $k_1$ lithography era with existing 193 nm ArF lithography. Lithography towards lower $k_1$ puts heavy demands on RET, exposure tools, and the need for litho-friendly design. 1.35 ArF hyper numerical aperture (NA) exposure tools may be used in the future. To help ensure that circuit design can be produced on to the substrate with workable process window, source-patterning device optimization (referred to herein as source-mask optimization or SMO) is becoming a significant RET for 2× nm node.

A source and patterning device (design layout) optimization method and system that allows for simultaneous optimization of the source and patterning device using a cost function without constraints and within a practicable amount of time is described in a commonly assigned International Patent Application No. PCT/US2009/065359, filed on Nov. 20, 2009, and published as WO2010/059954, titled "Fast Freeform Source and Mask Co-Optimization Method", which is hereby incorporated by reference in its entirety.

Another source and patterning device optimization method and system that involves optimizing the source by adjusting pixels of the source is described in a commonly assigned U.S. patent application Ser. No. 12/813,456, filed on Jun. 10, 2010, and published as U.S. Patent Application Publication No. 2010/0315614, titled "Source-Mask Optimization in Lithographic Apparatus", which is hereby incorporated by reference in its entirety.

BRIEF DESCRIPTION OF THE DRAWINGS

The above aspects and other aspects and features will become apparent to those ordinarily skilled in the art upon review of the following description of specific embodiments in conjunction with the accompanying figures, wherein.

DETAILED DESCRIPTION

Figure 1:
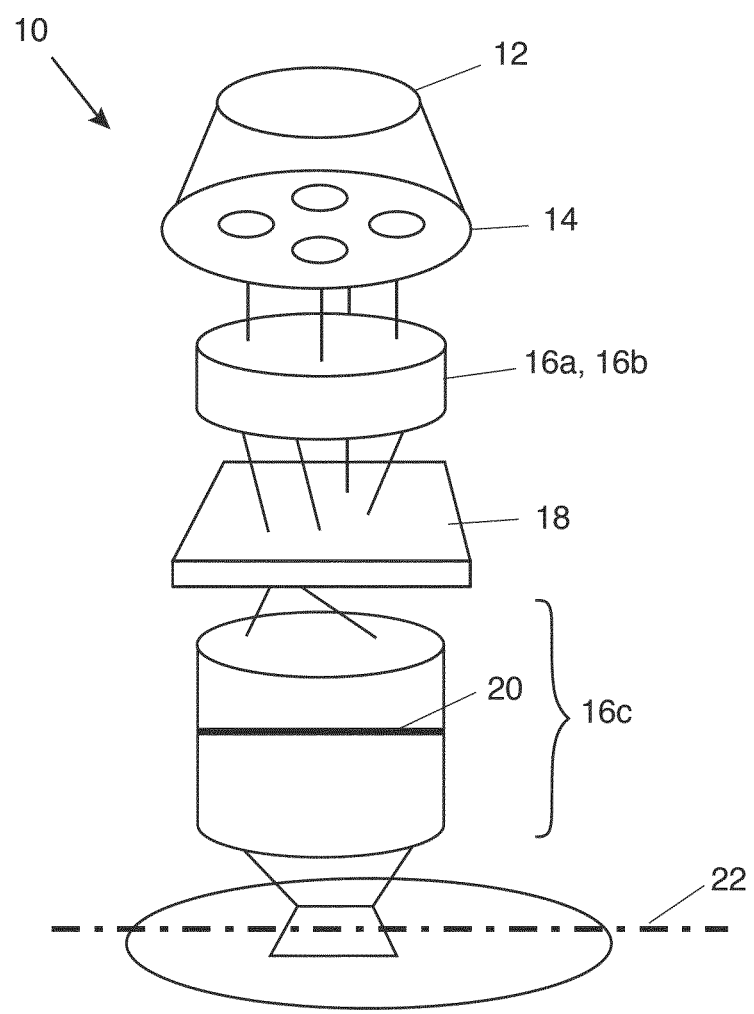
FIG. 1 is a block diagram of various subsystems of a lithography system according to an embodiment.

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

Although specific reference may be made in this text to the use of the embodiments in the manufacture of ICs, it should be explicitly understood that the embodiments has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein mean adjusting a lithographic projection apparatus such that results and/or processes of lithography have more desirable characteristics, such as higher accuracy of projection of design layouts on a substrate, larger process windows, etc.

Further, the lithographic projection apparatus may be of a type having two or more substrate tables (and/or two or more patterning device tables). In such "multiple stage" devices the additional tables may be used in parallel, or preparatory steps may be carried out on one or more tables while one or more other tables are being used for exposures. Twin stage lithographic projection apparatuses are described, for example, in U.S. Pat. No. 5,969,441, incorporated herein by reference.

The patterning device referred to above comprise design layouts. The design layouts can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. One of the goals in integrated circuit fabrication is to faithfully reproduce the original circuit design on the substrate (via the patterning device).

The term patterning device as employed in this text may be broadly interpreted as referring to generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The matrix addressing can be performed using suitable electronics. More information on such mirror arrays can be gleaned, for example, from U.S. Pat. Nos. 5,296,891 and 5,523,193, which are incorporated herein by reference.

a programmable LCD array. An example of such a construction is given in U.S. Pat. No. 5,229,872, which is incorporated herein by reference.

As a brief introduction, FIG. 1 illustrates an exemplary lithographic projection apparatus 10. Major components are an illumination source 12, which may be a deep-ultraviolet excimer laser source or other type of sources including extreme ultra violet (EUV) sources, illumination optics which define the partial coherence (denoted as sigma) and which may include optics 14, 16a and 16b that shape radiation from the source 12; a patterning device (e.g., a mask or reticle) 18; and transmission optics 16c that project an image of the patterning device pattern onto a substrate plane 22. An adjustable filter or aperture 20 at the pupil plane of the projection optics may restrict the range of beam angles that impinge on the substrate plane 22, where the largest possible angle defines the numerical aperture of the projection optics NA=sin($\Theta_{max}$).

In an optimization process of a system, a figure of merit of the system can be represented as a cost function. The optimization process boils down to a process of finding a set of parameters (design variables) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations. The term "evaluation points" herein should be interpreted broadly to include any characteristics of the system. The design variables of the system can be confined to finite ranges and/or be interdependent due to practicalities of implementations of the system. In case of a lithographic projection apparatus, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

In a lithographic projection apparatus, a source provides illumination (i.e. radiation); projection optics direct and shapes the illumination via a patterning device and onto a substrate.

The term "projection optics" is broadly defined here to include any optical component that may alter the wavefront of the radiation beam. For example, projection optics may include at least some of the components 14, 16a, 16b and 16c. An aerial image (AI) is the radiation intensity distribution on the substrate. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in commonly assigned U.S. patent application Ser. No. 12/315,849, disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the patterning device and the projection optics) dictate the aerial image. Since the patterning device used in the lithographic projection apparatus can be changed, it is desirable to separate the optical properties of the patterning device from the optical properties of the rest of the lithographic projection apparatus including at least the source and the projection optics.

Figure 2:
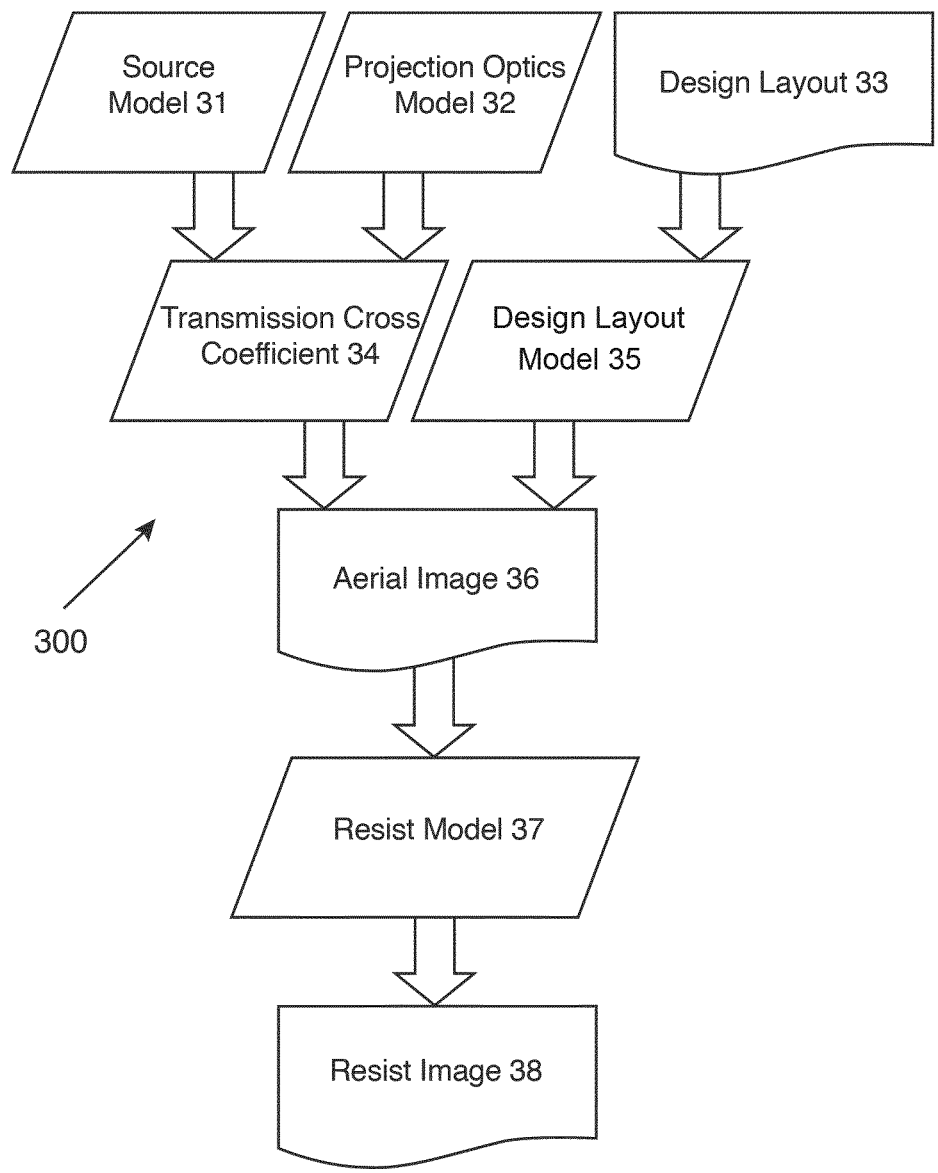
FIG. 2 is a block diagram of simulation models corresponding to the subsystems in FIG. 2.

An exemplary flow chart for simulating lithography in a lithographic projection apparatus is illustrated in FIG. 2. A source model 31 represents optical characteristics (including radiation intensity distribution and/or phase distribution) of the source. A projection optics model 32 represents optical characteristics (including changes to the radiation intensity distribution and/or the phase distribution caused by the projection optics) of the projection optics. The projection optics model 32 may include aberration caused by various factors, for example, heating of the components of the projection optics, stress caused by mechanical connections of the components of the projection optics. The source model 31 and the projection optics model 32 can be combined, as explained later herein, into a transmission cross coefficient (TCC) model 34. A design layout model 35 represents optical characteristics (including changes to the radiation intensity distribution and/or the phase distribution caused by a given design layout 33) of a design layout 33, which is the representation of an arrangement of features of a patterning device. An aerial image 36 can be simulated from the transmission cross coefficient 34 and the design layout model 35. A resist image 38 can be simulated from the aerial image 36 using a resist model 37. Simulation of lithography can, for example, predict contours and CDs in the resist image.

More specifically, it is noted that the source model 31 can represent the optical characteristics of the source that include, but not limited to, NA-sigma (σ) settings as well as any particular illumination source shape (e.g. off-axis radiation sources such as annular, quadrupole, and dipole, etc.). The projection optics model 32 can represent the optical characteristics of the of the projection optics that include aberration, distortion, refractive indexes, physical sizes, physical dimensions, absorption, etc. The design layout model 35 can also represent physical properties of a physical patterning device, as described, for example, in U.S. Pat. No. 7,587,704, which is incorporated by reference in its entirety. The objective of the simulation is to accurately predict, for example, edge placements and CDs, which can then be compared against an intended design. The intended design is generally defined as a pre-OPC design layout which can be provided in a standardized digital file format such as GDSII or OASIS or other file format.

From this design layout, one or more portions may be identified, which are referred to as "clips". In a specific embodiment, a set of clips is extracted, which represents the complicated patterns in the design layout (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed. In other words, clips may be the portions of the design layout or may be similar or have a similar behavior of portions of the design layout where critical features are identified either by experience (including clips provided by a customer), by trial and error, or by running a full-chip simulation. Clips usually contain one or more test patterns or gauge patterns.

An initial larger set of clips may be provided a priori by a customer based on known critical feature areas in a design layout which require particular image optimization. Alternatively, in another embodiment, the initial larger set of clips may be extracted from the entire design layout by using some kind of automated (such as, machine vision) or manual algorithm that identifies the critical feature areas.

Traditional OPC usually uses an aerial image or resist image at only one plane parallel to the substrate. However, the resist layer has a finite thickness (e.g., 120 nm), and may have multiple layers with different refractive indices. Portions of the resist layer at different distances to the substrate may be exposed to different environment during development, baking and etching. The aerial image at different planes parallel to the substrate may have different distribution of intensity and phase. Traditional OPC ignores the three dimension profiles of the resist image and the aerial image and therefore may not achieve the optimal result.

Figure 3:
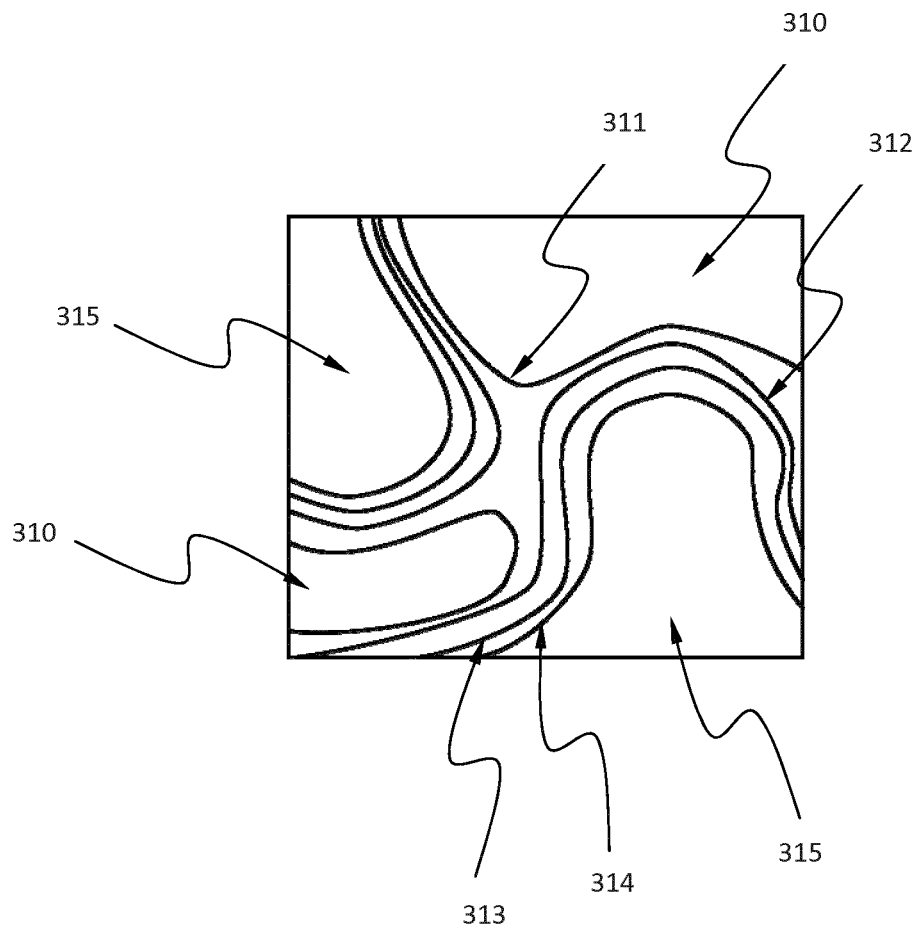
FIG. 3 shows exemplary contours of aerial images at different planes.

FIG. 3 shows exemplary contours 311-314 of aerial images at different planes. Areas 315 have higher intensity than areas 310.

FIGS. 4A-4F demonstrate the effect of the finite thickness of the resist layer.

Figure 4A:
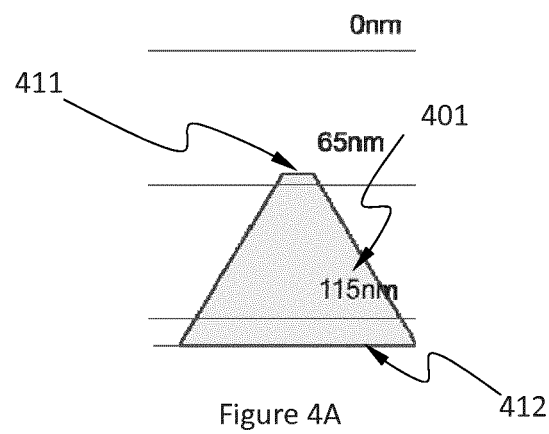
FIGS. 4A-4F demonstrate the effect of the finite thickness of the resist layer.
Figure 4B:
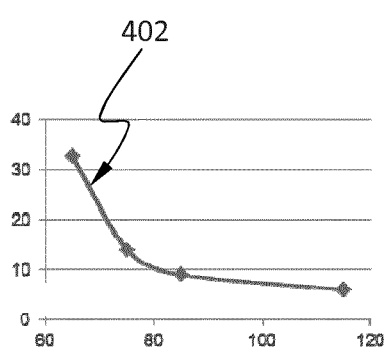
Figure 4C:
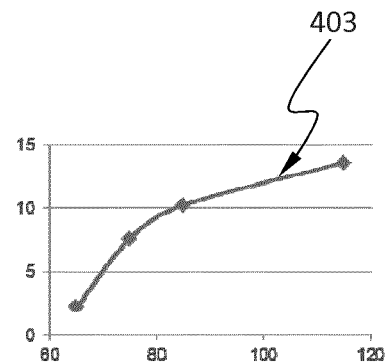
Figure 4D:
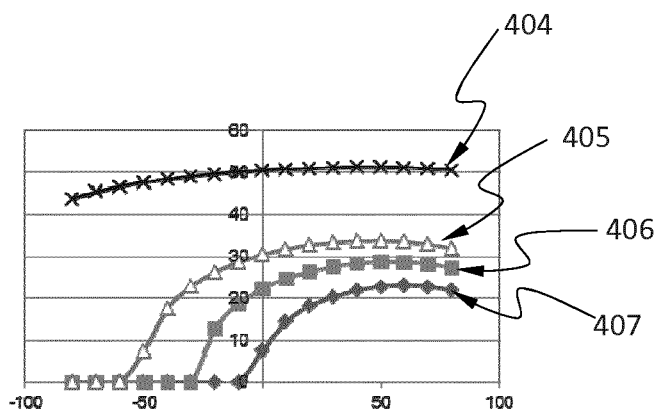

FIG. 4A schematically shows a vertical (perpendicular to the substrate) cross section of a feature 401 in the resist image. The cross section may not be a rectangle in shape. A portion of the resist layer is removed from the top (i.e., the plane marked "0 nm") of the pre-exposure resist layer. The width 411 at the upper surface of this feature 401 is much narrower than the width 412 at the lower surface of this feature 401. The cross section may also be slanted. FIG. 4B shows the mask error enhancement factor (MEEF) 402 at different depth of this feature 401. The horizontal axis is depth from the top of the pre-exposure resist layer; the vertical axis is MEEF. FIG. 4C shows the image log slope (ILS) 403 at different depths of this feature 401. The horizontal axis is depth from the top of the pre-exposure resist layer; the vertical axis is ILS. FIG. 4D shows depth of focus (DOF) 404-407 at different depths of this feature 401. The horizontal axis is delta defocus; the vertical axis is DOF.

Figure 4E:
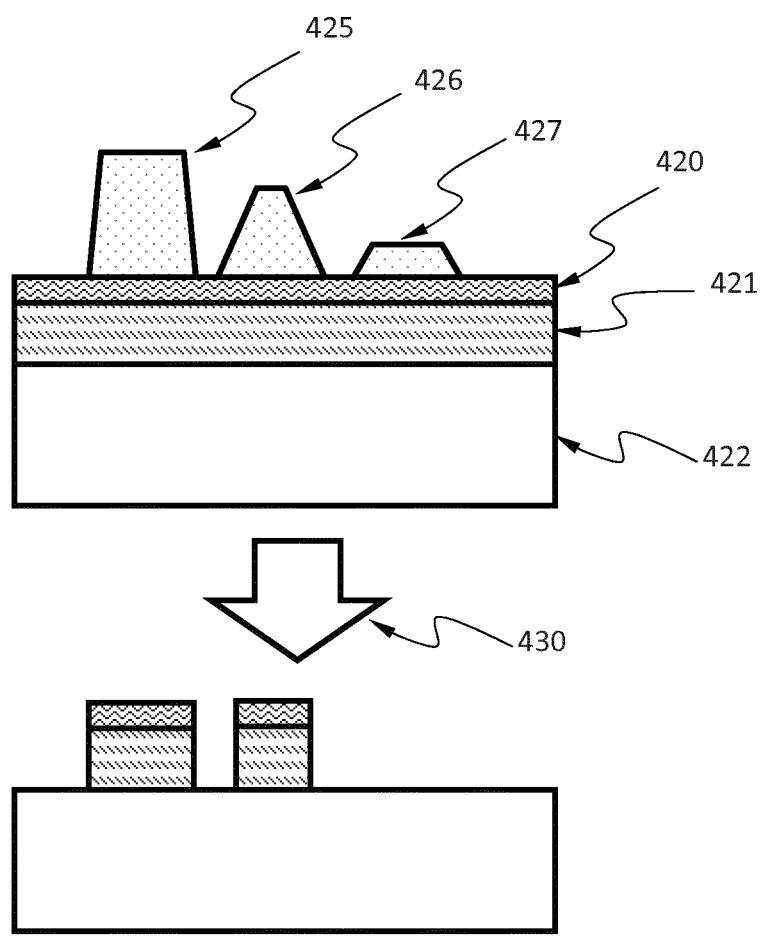
Figure 4F:
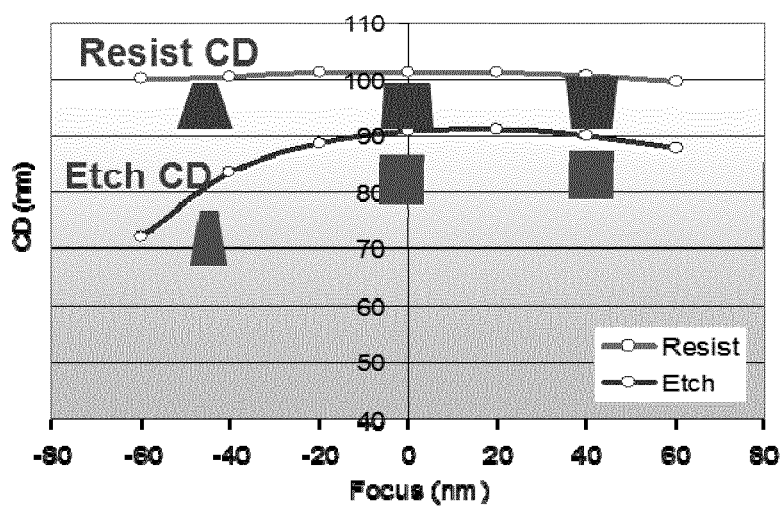

FIG. 4E schematically shows the effect of the cross sectional shape of a feature on etching. Three features 425, 426 and 427 of the resist image have the same width at the respectively bottom surface. The resist layer is on a hard mask 420 such as a chromium layer. A poly silicon layer 421 is between the hard mask 420 and the substrate 422. After etching 430, the feature 427 is entirely consumed and leaves no etched feature in the hard mask and poly silicon underneath. Despite features 425 and 426 having the same width at the bottom surface, the etched features they leave underneath have different widths. FIG. 4F schematically shows that similar CD in resist features may yield different CD in etched features, when the cross sectional shapes of the resist features are different.

Figure 5:
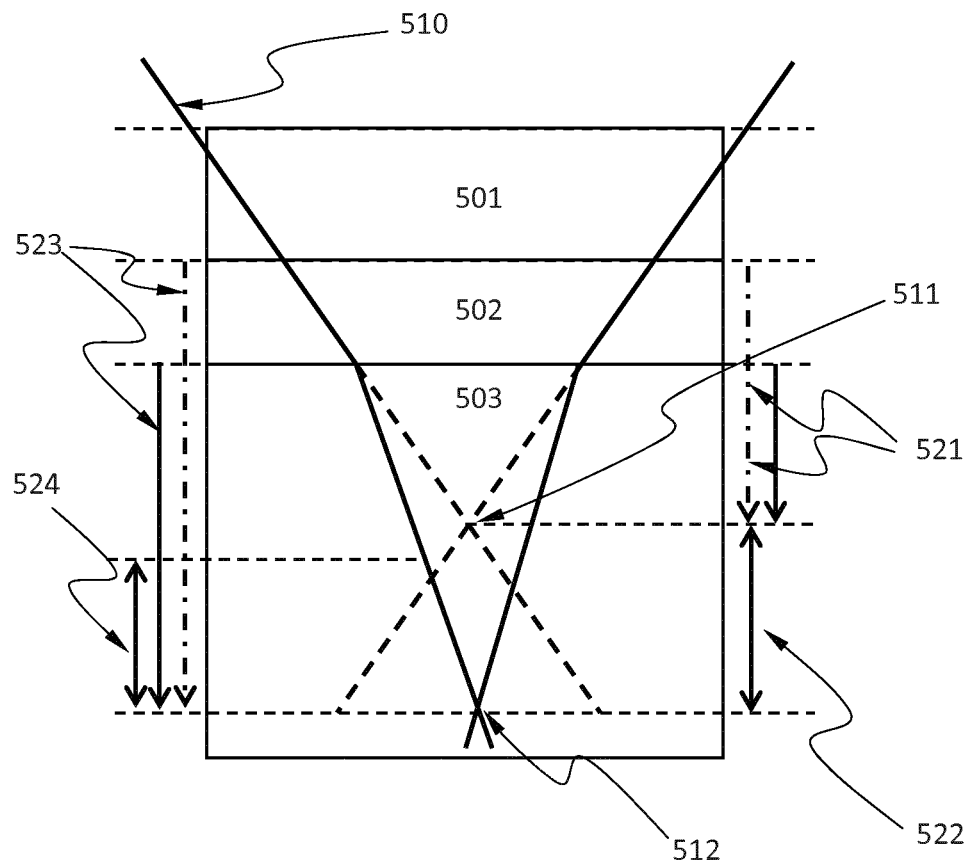
FIG. 5 illustrates several quantities relevant to this disclosure.

FIG. 5 illustrates several quantities relevant to this disclosure. Radiation 510 from the source passes through air or water layer 501, an optional top anti-reflective coating (TARC) layer 502 and reaches a resist layer 503.

Defocus 521 is defined as the distance between the uppermost (i.e., farthest from the substrate) surface of the resist layer 503 when the TARC layer 502 does not exist or the uppermost surface of the TARC layer 502 if it does exist, and where the focal plane 511 would be if there were no resist layer 503. A negative value of the defocus means the focal plane 511 is below (i.e., closer to the substrate than) the uppermost surface.

Delta defocus 522 is an offset between an actual focus plane 512 and the focus plane 511. A positive value of delta defocus means that the actual focal plane 512 is below the focal plane 511.

AI location 523 (also known as aerial image location or imaging depth) is defined as the distance a plane of an aerial image and the uppermost (i.e., farthest from the substrate) surface of the resist layer 503 when the TARC layer 502 does not exist or the uppermost surface of the TARC layer 502 if it does exist. The AI location 523 is usually selected empirically. For example, in some simulation software, the AI location 523 is selected to be about 80% of the thickness of the resist layer 503. A positive value of the AI location 523 means the aerial image in below the uppermost surface.

Delta AI location 524 is an offset between two different aerial image planes.

According to an embodiment, the source mask optimization (SMO) may use a characteristic that describes three-dimensional resist profile, a characteristic that describes three-dimensional radiation field projected from the projection optics, or both.

Figure 6A:
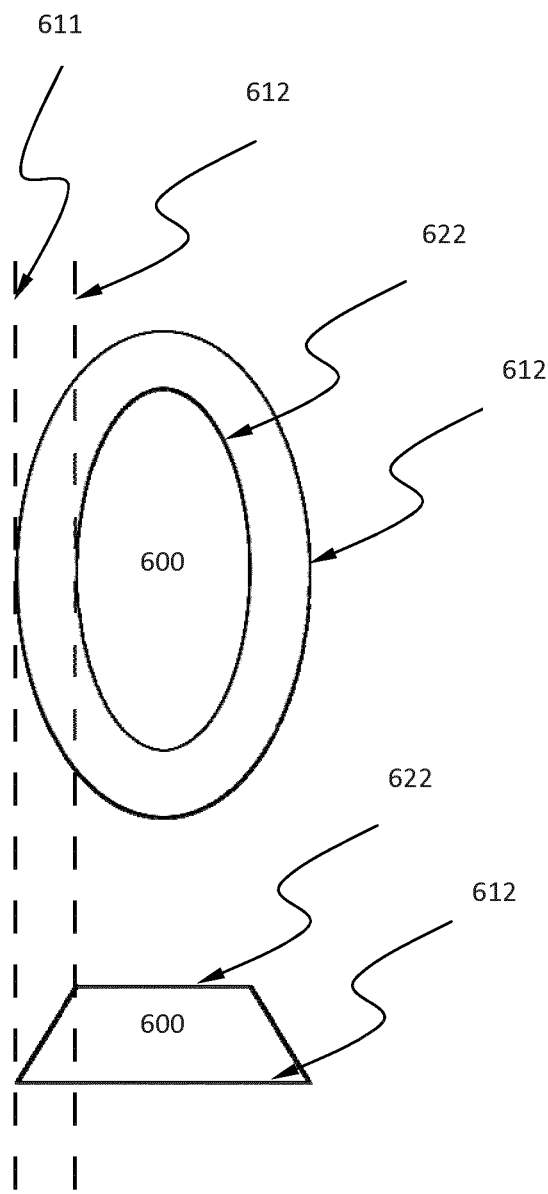
FIG. 6A shows an example of characteristics associated with portions of the resist image at different planes.

According to an embodiment, a first characteristic and a second characteristic of a resist image may be used in SMO (e.g., a cost function being a function of the first and second characteristics) and the first and second characteristics are associated with portions of the resist image at different planes. The first and second characteristics may be any suitable characteristics. For example, the first and second characteristics may selected from MEEF at different planes, ILS at different planes, edge locations at different planes, edge placement errors (EPE) at different planes. In the example in FIG. 6A, the first characteristic is an edge location 611 at a bottom surface 621 of a feature 600 in the resist image; the second characteristic is an edge location 612 at a top surface 622 of the feature 600. SMO can use the first and second characteristics in any suitable ways. For example, SMO may use the first and second characteristics independently or use a function of the first and second characteristics (e.g., a difference between them). For example, the SMO may select and use the greater or the lesser from the first and second characteristics.

Figure 6B:
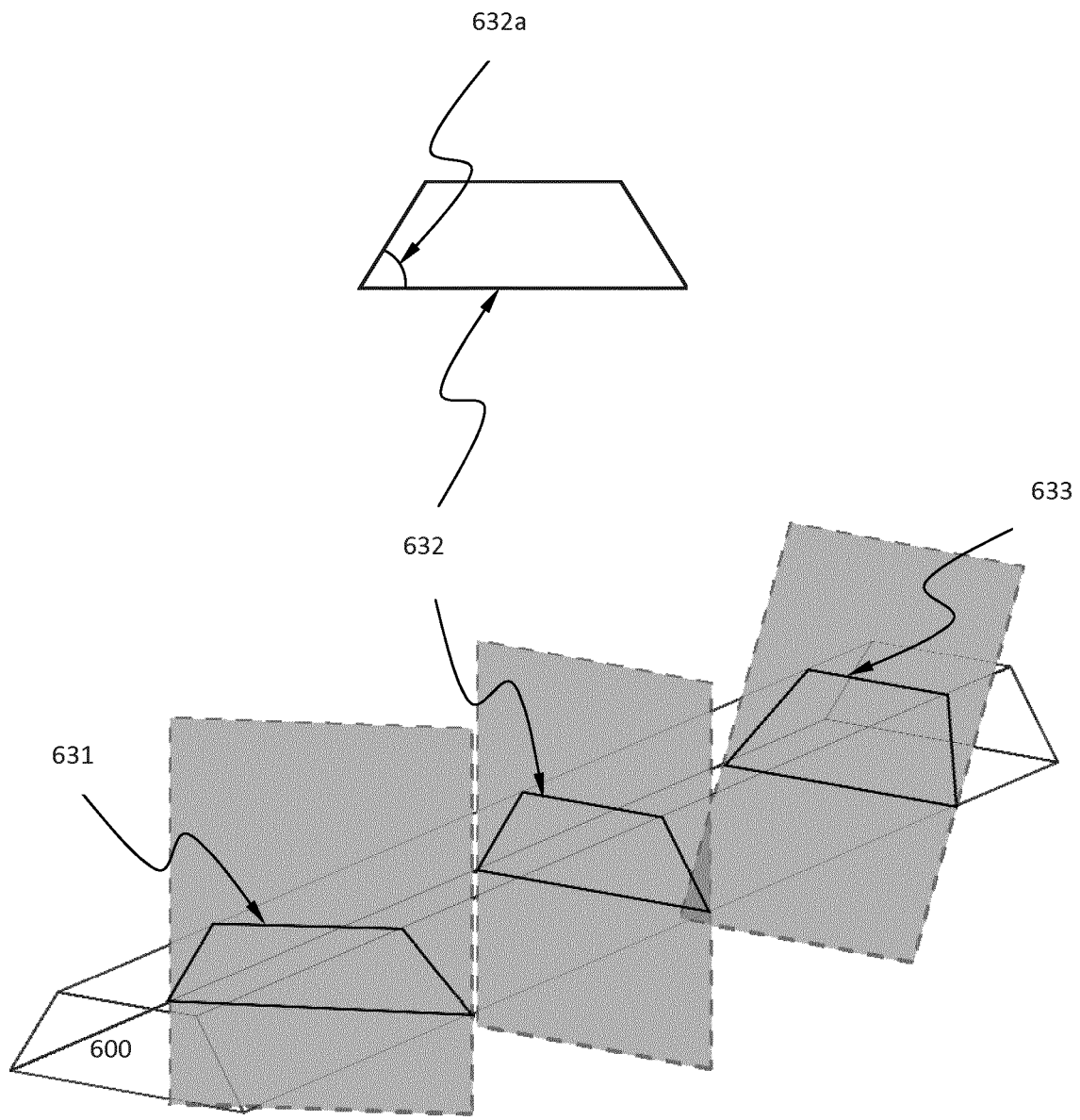
FIG. 6B shows an example of characteristics of cross sections of a resist image along a surface not parallel to the substrate.

According to an embodiment, a characteristic of a cross section of a resist image along a surface (planar or non-planar) not parallel to the substrate may be used in SMO. For example, the cross section may be perpendicular to the substrate. In the example in FIG. 6B, a characteristic of cross sections 631, 632 and 633 of the feature 600 may be used. Specifically, the characteristic may be a sidewall angle 632a. Cross sections 631, 632 are perpendicular to the substrate but cross section 633 is not.

According to an embodiment, at least one characteristic of a first aerial image and at least one characteristic of a second aerial image may be used in SMO and the first and second aerial images are not on a same plane. Namely, delta AI location between these two aerial images is non-zero.

Various embodiments provide methods and systems to include a characteristic that describes three-dimensional resist profile, a characteristic that describes three-dimensional radiation field projected from the projection optics, or both, into the source mask optimization (SMO) calculation. This process can be referred to hereinafter as the profile aware SMO. Examples of methods describing SMO procedures can be found, for example, in U.S. patent application Ser. No. 12/914,946 filed Oct. 28, 2010, the disclosure of which is hereby incorporated by reference in its entirety.

In one or more embodiments, the SMO procedure can be performed using a cost function, which may be expressed as follows $$CF(z_1, z_2, \ldots, z_N) = \sum_{p=1}^{P} w_p f_p^2(z_1, z_2, \ldots, z_N) \quad \text{(Eq. 1)}$$

wherein $(z_1, z_2, \ldots, z_N)$ are N design variables or values thereof; $f_p(z_1, z_2, \ldots, z_N)$ is a difference between an actual value and an intended value of a characteristic at the p-th evaluation point for a set of values of the design variables of $(z_1, z_2, \ldots, z_N)$. $w_p$ is a weight constant assigned to the p-th evaluation point. An evaluation point or pattern more critical than others can be assigned a higher $w_p$ value. Patterns and/or evaluation points with larger number of occurrences may be assigned a higher $w_p$ value, too. Examples of the evaluation points can be any physical point or pattern on the wafer, or any point on a virtual design layout, or resist image, or aerial image. In profile aware SMO, the cost function CF is a function of a three-dimensional resist profile, a three-dimensional radiation field projected from the projection optics, or both. For example, at least one $f_p(z_1, z_2, \ldots, z_N)$ is a function of a characteristic that describes three-dimensional resist profile, a characteristic that describes three-dimensional radiation field projected from the projection optics, or both. For example, $f_p(z_1, z_2, \ldots, z_N)$ may be a function of an EPE at one plane in the resist image and $f_p(z_1, z_2, \ldots z_N)$ may be a function of an EPE at another plane in the resist image. For example, $f_p(z_1, z_2, \ldots, z_N)$ may be a function of a difference between an EPE at one plane and an EPE at another plane. For example, $f_p(z_1, z_2, \ldots, z_N)$ may be a function of sidewall angle. For example, $f_p(z_1, z_2, \ldots, z_N)$ may be a function of resist tilt. The term "three-dimensional resist profile" as used herein may be a three-dimensional geometric shape of the resist layer after a post-exposure step such as development, post-exposure baking, washing, etc. The three-dimensional resist profile may be simulated or measured from an actual resist layer. The term "three-dimensional radiation field" as used herein may include intensity, phase or both in a three-dimensional space between the projection optics and the substrate, which may include the space occupied by the resist layer. The cost function may represent any suitable characteristics of the lithographic projection apparatus or the substrate, for instance, focus, CD, image shift, image distortion, image rotation, etc. For example, the cost function may be a function of one or more of the following lithographic metrics: edge placement error, critical dimension, resist contour distance, worst defect size, and best focus shift. Since it is the resist image that often dictates the circuit pattern on a substrate, the cost function often includes functions that represent some characteristics of the resist image. For example, $f_p(z_1, z_2, \ldots, z_N)$ of such an evaluation point can be simply a distance between a point in the resist image to an intended position of that point (i.e., edge placement error $EPE_p(z_1, z_2, \ldots, z_N)$). The design variables can be any adjustable parameters such as adjustable parameters of the source, the patterning device, the projection optics, dose, focus, etc. In an embodiment, at least some of the design variables are adjustable characteristics of the projection optics. The projection optics may include components collectively called a "wavefront manipulator" that can be used to adjust shapes of a wavefront and intensity distribution and/or phase shift of the irradiation beam. The projection optics can adjust a wavefront and intensity distribution at any location along an optical path of the lithographic projection apparatus, such as before the patterning device, near a pupil plane, near an image plane, near a focal plane. The projection optics can be used to correct or compensate for certain distortions of the wavefront and intensity distribution caused by, for example, the source, the patterning device, temperature variation in the lithographic projection apparatus, and/or thermal expansion of components of the lithographic projection apparatus. Adjusting the wavefront and intensity distribution can change values of the evaluation points and the cost function. Such changes can be simulated from a model or actually measured.

It should be noted that the normal weighted root mean square (RMS) of $f_p(z_1, z_2, \ldots, z_N)$ is defined as $$\sqrt{\frac{1}{P}\sum_{p=1}^{P} w_p f_p^2(z_1, z_2, \ldots, z_N)},$$

therefore, minimizing the weighted RMS of $f_p(z_1, z_2, \ldots, z_N)$ is equivalent to minimizing the cost function $$CF(z_1, z_2, \ldots, z_N) = \sum_{p=1}^{P} w_p f_p^2(z_1, z_2, \ldots, z_N),$$

defined in Eq. 1. Thus the weighted RMS of $f_p(z_1, z_2, \ldots, z_N)$ and Eq. 1 may be utilized interchangeably for notational simplicity herein.

Further, if the PW (Process Window) is maximized, it is possible to consider the same physical location from different PW conditions as different evaluation points in the cost function in (Eq.1). For example, if N PW conditions are considered, then the evaluation points can be categorized according to their PW conditions and the cost functions can be written as:

$$CF(z_1, z_2, \ldots, z_N) = \sum_{p=1}^{P} w_p f_p^2(z_1, z_2, \ldots, z_N) = \sum_{u=1}^{U} \sum_{p_u=1}^{P_u} w_{p_u} f_{p_u}^2(z_1, z_2, \ldots, z) \quad \text{(Eq. 1')}$$

where $f_p(z_1, z_2, \ldots, z_N)$ is the difference between an actual value and an intended value of the $p_i$-th evaluation point for a set of values of the design variables of $(z_1, z_2, \ldots, z_N)$ under the u-th PW condition u=1, . . . , U. When this difference is the edge placement error (EPE), then minimizing the above cost function is equivalent to minimizing the edge shift under various PW conditions, thus this leads to maximizing the PW. In particular, if the PW also consists of different patterning device bias, then minimizing the above cost function also includes the minimization of MEEF (Mask Error Enhancement Factor), which is defined as the ratio between the wafer EPE and the induced mask edge bias.

The design variables may have constraints, which can be expressed as $(z_1, z_2, \ldots, z_N) \in Z$, where Z is a set of possible values of the design variables. The constraints may represent physical restrictions in a hardware implementation of the lithographic projection apparatus. The constraints may include one or more of: tuning ranges, rules governing patterning device manufacturability, and interdependence between the design variables.

The optimization process therefore is to find a set of values of the design variables, under the constraints $(z_1, z_2, \ldots, z_N) \in Z$, that minimize the cost function, i.e., to find $$(\tilde{z}_1, \tilde{z}_2, \ldots \tilde{z}_N) = \underset{(z_1,z_2,\ldots,z_N) \in Z}{\operatorname{argmin}} CF(z_1, z_2, \ldots, z_N) = \underset{(z_1,z_2,\ldots,z_N) \in Z}{\operatorname{argmin}} \sum_{p=1}^{P} w_p f_p^2(z_1, z_2, \ldots, z_N) \quad \text{(Eq. 2)}$$

Figure 7:
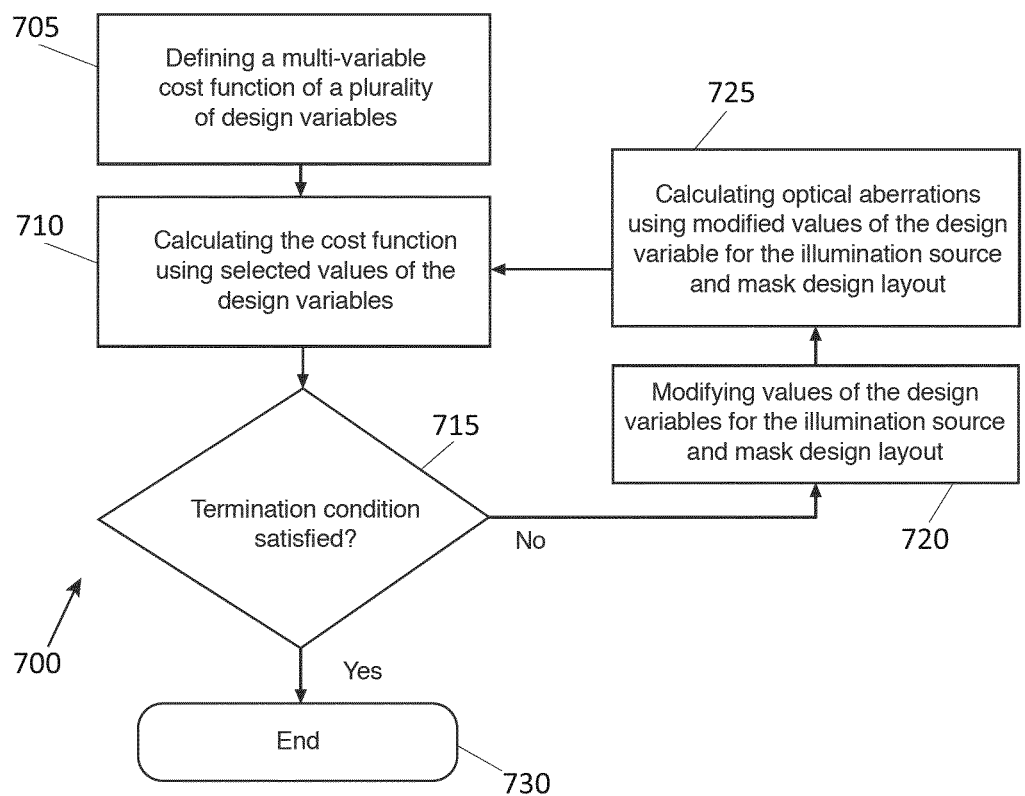
FIG. 7 shows an embodiment of an SMO method according to an embodiment.

An SMO method of optimizing the lithography projection apparatus, according to an embodiment, is illustrated in FIG. 7. This method comprises a procedure 705 of defining a multi-variable cost function of a plurality of design variables. The design variables are characteristics of the illumination source and the patterning device design layout. In procedure 710, the cost function is calculated or computer using the selected variables. As will be appreciated by the skilled artisan, as part of calculating the cost function, the image of the patterning device pattern/layout is calculated. This is done using the projection optics model. Once the cost function is calculated for the selected variables, the method proceeds to procedure 715 where it is determined if a particular or predetermined termination is satisfied. The predetermined termination condition may include various possibilities, i.e. the cost function may be minimized or maximized, as required by the numerical technique used, the value of the cost function has been equal to a threshold value or has crossed the threshold value, the value of the cost function has reached within a preset error limit, or a preset number of iteration is reached. If the condition in procedure 715 is satisfied, the method ends. If the condition in procedure 715 is not satisfied, the method proceeds to procedure 720 where values of the design variables for the illumination source and patterning device design layout are modified, and then to procedure 725 where new/modified optical aberrations are calculated and/or determined using modified values of the design variables for the illumination source and patterning device design layout or using modified values of the design variables for the illumination source and a simplified reticle of the modified patterning device design layout. Those new/modified optical aberrations define a modified projection optics model, which, along with the modified illumination source model (i.e. the illumination source model including the modified design variables), provide modified transmission cross coefficients TCCs which are used when calculating the cost function. Specifically, once the transmission cross coefficients TCCs are known, the aerial image, the resist image, the $f_{p_u}(z_1, z_2, \ldots, z_N)$ and the cost function can be computed. Examples of methods for determining and/or computing the transmission cross coefficients TCCs are described in U.S. Patent Application Ser. No. 61/412,372, filed on Nov. 10, 2010, which is incorporated by reference in its entirety.

Procedures 710-725 are iteratively repeated until the termination condition is satisfied.

In the methods of FIG. 5, the source and patterning device can be optimized simultaneously (referred to as simultaneous optimization), according to embodiments. The terms "simultaneous", "simultaneously", "joint" and "jointly" as used herein mean that the design variables of the characteristics of the source, patterning device, projection optics and/or any other design variables, are allowed to change at the same time.

In another embodiment, instead of, or in addition to, calculating and/or determining the effect on the optical characteristics of the projection optics, it is envisioned that adjustable optical characteristics of the projection optics can be included in the design variables. Exemplary adjustable optical characteristics may include as lens manipulators, the temperature data or signal associated with the temperature data of one or more devices, e.g. heaters, utilized to control the temperature of an optical element of the projection system, Zernike coefficients. The SMO procedure can then be carried out and the design variables, including the adjustable optical characteristics, can be simultaneously adjusted so that the cost function is moved towards convergence.

Figure 8:
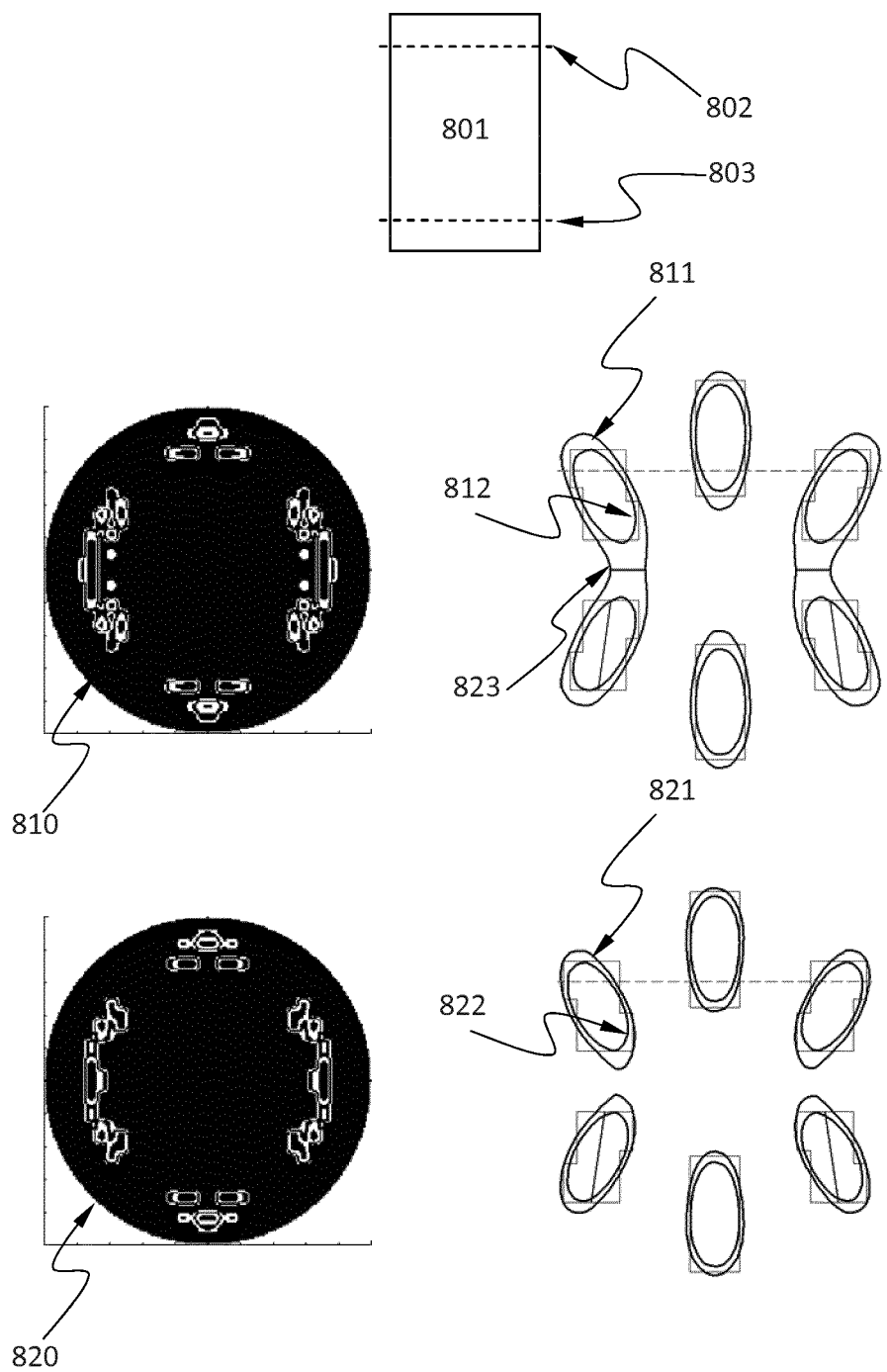
FIG. 8 shows an exemplary result of profile aware SMO.

FIG. 8 shows an exemplary result of profile aware SMO. In this example, there is not a TARC layer. The resist layer 801 has a thickness of 105 nm. Characteristics of two aerial images, at a plane 802 with an AI location of 15 nm and at a plane 803 with an AI location of 90 nm, are included in profile aware SMO. The delta AI between these two planes 802 and 803 is 75 nm. Pupil profile 810 is a result of SMO using only the aerial image at plane 803 but not using the aerial image at plane 802. The corresponding resist image top contour 811 and bottom contour 812 indicate a severe top loss that results a defect 823, where two discrete holes merge. In contrast, Pupil profile 820 is a result of profile aware SMO using both the aerial image at plane 803 and the aerial image at plane 802. The corresponding resist image top contour 821 and bottom contour 822 indicate absence of a defect.

Figure 9:
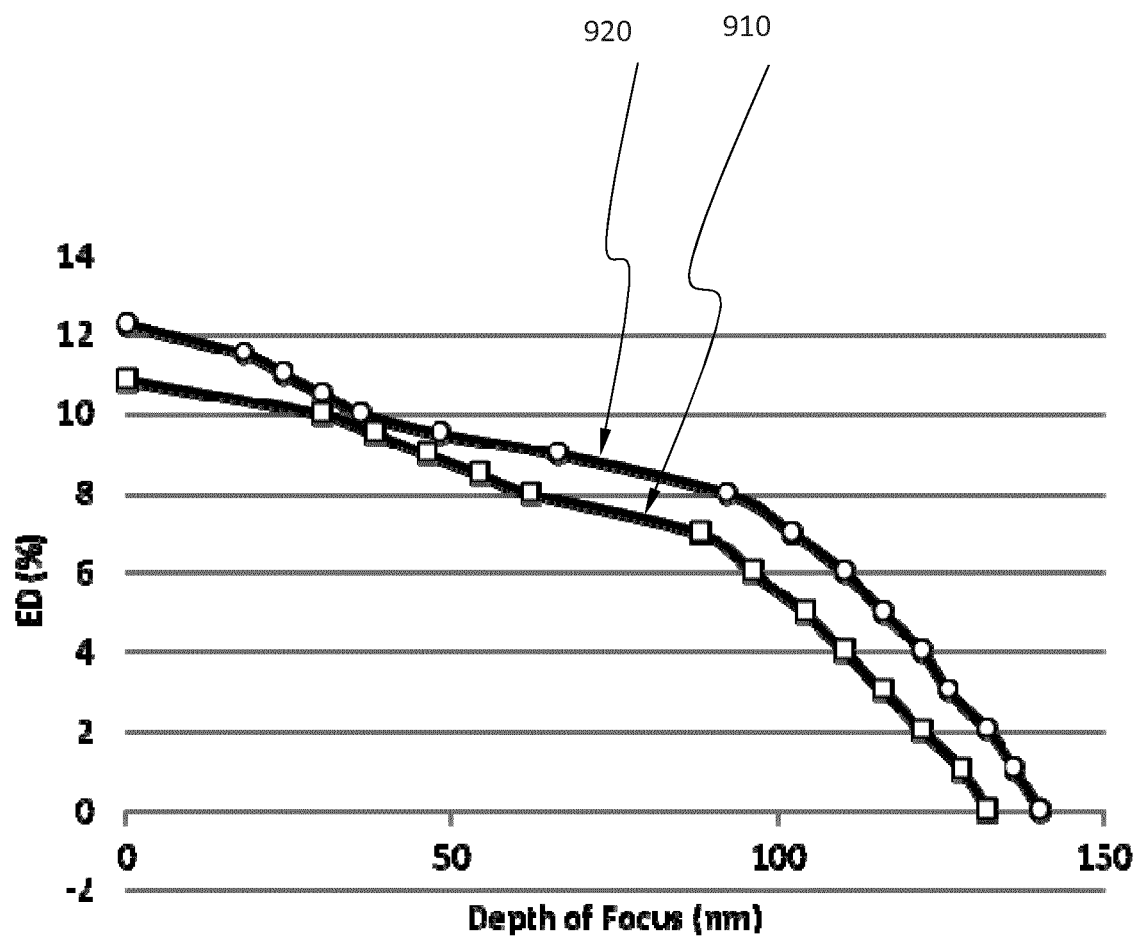
FIG. 9 shows process windows of profile aware SMO and conventional SMO.

FIG. 9 shows process windows 910 of SMO using only the aerial image at plane 803 but not using the aerial image at plane 802 and process window 920 of profile aware SMO using both the aerial image at plane 803 and the aerial image at plane 802. Process window 920 is bigger than process window 910.

Figure 10:
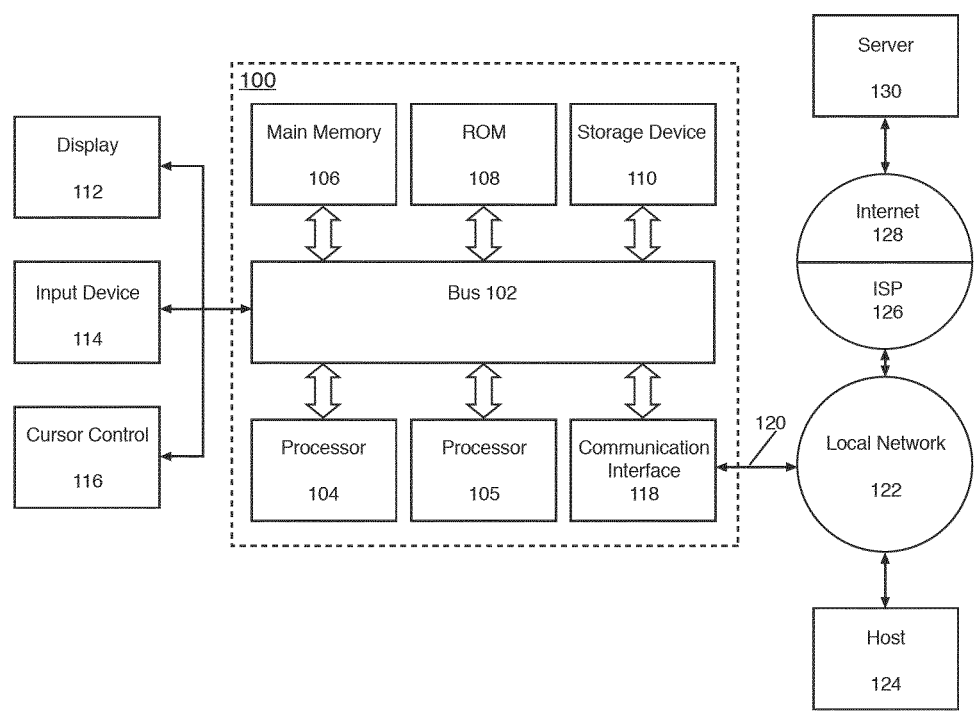
FIG. 10 is a block diagram of an example computer system in which embodiments can be implemented.

FIG. 10 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with one or more embodiments, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 11:
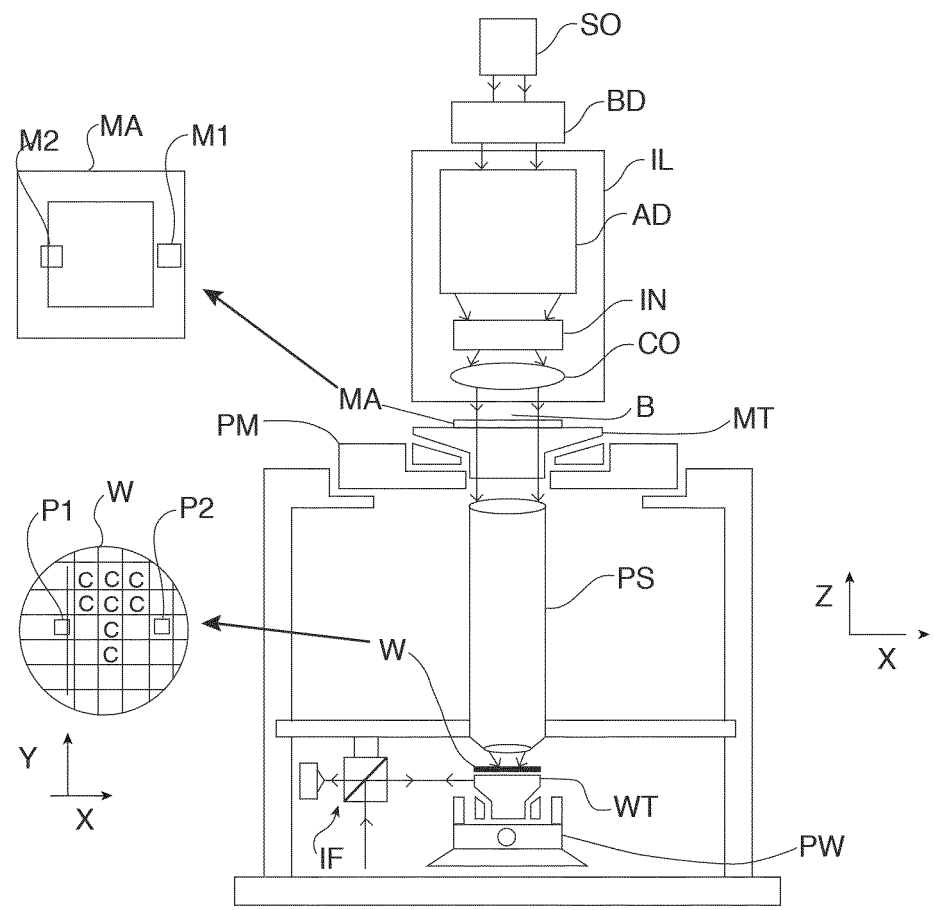
FIG. 11 is a schematic diagram of a lithographic projection apparatus to which embodiments are applicable.

FIG. 11 schematically depicts an exemplary lithographic projection apparatus whose illumination source could be optimized utilizing the methods described herein. The apparatus comprises:

- a radiation system IL, to supply a projection beam B of radiation. In this particular case, the radiation system also comprises a radiation source SO;
- a first object table (e.g., mask table) MT comprising a holder configured to hold a patterning device MA (e.g., a mask or a reticle), and connected to a first positioner to accurately position the patterning device with respect to item PS;
- a second object table (substrate table) WT comprising a substrate holder to hold a substrate W (e.g., a resist-coated silicon wafer), and connected to a second positioner to accurately position the substrate with respect to item PS; and
- a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive mask). However, in general, it may also be of a reflective type, for example (with a reflective patterning device). Alternatively, the apparatus may employ another kind of patterning device as an alternative to the use of a mask; examples include a programmable mirror array or LCD matrix.

The source SO (e.g., a mercury lamp or excimer laser) produces a beam of radiation. This beam is fed into an illumination system (illuminator) IL, either directly or after having traversed a conditioner, such as a beam expander Ex, for example. The illuminator IL may comprise an adjuster AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 11 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioner (and interferometric measuring device IF), the substrate table WT can be moved accurately, e.g. so as to position different target portions C in the path of the beam PB. Similarly, the first positioner can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 9. However, in the case of a wafer stepper (as opposed to a step-and-scan tool) the patterning device table MT may just be connected to a short stroke actuator, or may be fixed.

The depicted tool can be used in two different modes:

- In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;
- In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Figure 12:
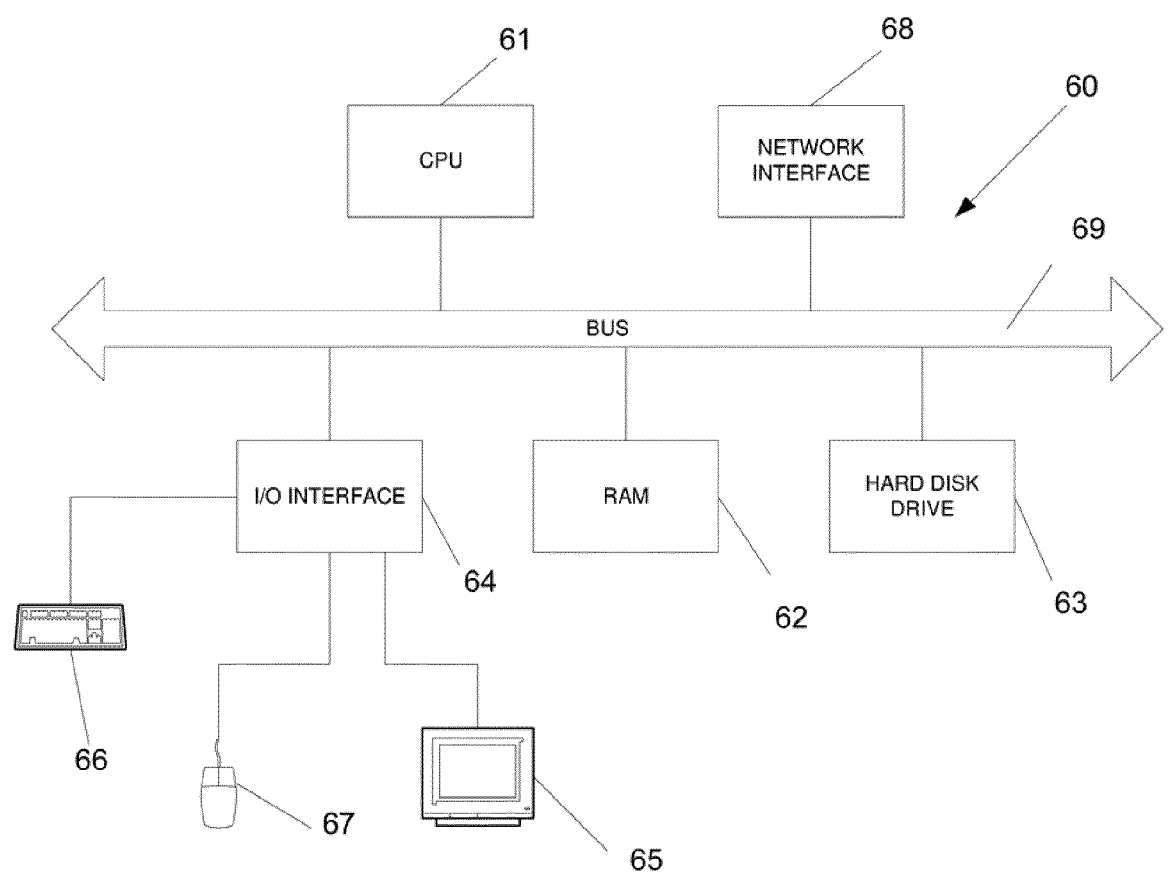
FIG. 12 is a schematic depiction of a computer suitable for implementing an embodiment.

FIG. 12 shows a computer 60. The computer 60 may implement any of the methods described herein including implement a simulation of a BCP feature and/or calculate an uncertainty associated with the positioning of a polymer domain with the BCP feature using any of the methods described herein. The computer 60 comprises a CPU (central processing unit) 61 which is configured to read and execute instructions stored in a memory 62 which may take the form of a random access memory. The memory 62 stores instructions for execution by the CPU 61 and data used by those instructions. For example, in use, a digital representation of a BCP feature and/or associated parameters (e.g., the block copolymer types, the BCP feature design shape, etc.) may be stored in the memory 62, together with instructions suitable for causing the computer to carry out a method as described herein.

The computer 60 may further comprise storage in the form of a hard disc drive 63. The digital representation of the BCP feature and/or the associated parameters may be stored on the hard disc drive 63. The computer 60 may further comprise an I/O (input/output) interface 64 to which is connected one or more peripheral devices used in connection with the computer 60. For instance, a display 65 may be provided so as to display output from the computer 60. The display 65 may, for example, display a representation of the BCP feature. Additionally, the display 65 may display one or more images generated by processing of the simulated BCP feature, or a design of a substrate such as shown in FIG. 2.

One or more input devices may be connected to the interface 64. Such an input device may include a keyboard 66 and/or a mouse 67 which allows user interaction with the computer 60.

A network interface 68 may be provided to allow the computer 60 to be connected to an appropriate computer network so as to receive and/or transmit data from and to other computing devices. The CPU 61, memory 62, storage 63, I/O interface 64 and network interface 68, are connected together by a bus 69.

The disclosure may be summarized in the following clauses:

1. A computer-implemented method for improving a lithographic process for imaging a portion of a design layout onto a substrate using a lithographic projection apparatus comprising an illumination source and projection optics, the method comprising: computing a multi-variable cost function of a plurality of design variables that are characteristics of the lithographic process, at least some of the design variables being characteristics of the illumination source and the design layout, wherein the multi-variable cost function is a function of a three-dimensional resist profile on the substrate, a three-dimensional radiation field projected from the projection optics, or both; and reconfiguring the characteristics of the lithographic process by adjusting the design variables until a predefined termination condition is satisfied.

2. The method of clause 1, wherein the multi-variable cost function is a function of a first characteristic and a second characteristic of the three-dimensional resist profile, or a function of a first characteristic and a second characteristic of the three-dimensional radiation field, wherein the first and second characteristics are associated with portions of the three-dimensional resist profile at different distances from the substrate or the first and second characteristics are associated with portions of the three-dimensional radiation field at different distances from the substrate.

3. The method of clause 2, wherein the first and second characteristics are selected form a group consisting of MEEF, ILS, edge locations, edge placement errors, radiation intensity, phase and a combination thereof.

4. The method of clause 2, wherein the multi-variable cost function is a function of a difference between the first characteristic and the second characteristic.

5. The method of clause 2, wherein the multi-variable cost function is a function of the greater or the lesser of the first characteristic and the second characteristic.

6. The method of clause 1, wherein the multi-variable cost function is a function of a characteristic of a cross section of a resist image along a surface not parallel to the substrate.

7. The method of clause 6, wherein the surface is non-planar.

8. The method of clause 6, wherein the surface is perpendicular to the substrate.

9. The method of clauses 1 to 5, wherein the multi-variable cost function is a function of at least one characteristic of a first aerial image and at least one characteristic of a second aerial image, wherein the first and second aerial images are not on a same plane.

10. The method of clauses 1 to 9, wherein at least one of the design variables is a characteristic of the projection optics.

11. The method of clause 1 to 10, further comprising predicting the three-dimensional resist profile using a resist model.

12. The method of clauses 1 to 11, further comprising predicting the three-dimensional radiation field using a source model, a projection optics model and a design layout model.

13. The method of any of clauses 1 to 12, wherein the reconfiguring comprises redetermining the three-dimensional resist profile, the three-dimensional radiation field, or both, using at least some of the design variables that are characteristics of the design layout and/or the illumination source and that are adjusted.

14. The method of any of clauses 1 to 13, wherein the reconfiguring comprises computing the multi-variable cost function using the projection optics model.

15. The method of any of clauses 1 to 14, wherein the portion of the design layout comprises one or more selected from: an entire design layout, a clip, a section of a design layout that is known to have one or more critical features, and a section of the design layout where one or more critical features have been identified by a pattern selection method.

16. The method of any of clauses 1 to 15, wherein the predefined termination condition includes one or more selected from: minimization of the cost function; maximization of the cost function; reaching a preset number of iterations; reaching a value of the cost function equal to or beyond a preset threshold value; reaching a predefined computation time; and, reaching a value of the cost function within an acceptable error limit.

17. The method of any of clauses 1 to 16, wherein the iterative reconfiguration is performed without constraints or with constraints dictating the range of at least some of the design variables.

18. The method of any of clauses 1 to 17, wherein at least some of the design variables are under constraints representing physical restrictions in a hardware implementation of the lithographic projection apparatus.

19. The method of any of clause 18, wherein the constraints include one or more of: tuning ranges, rules governing patterning device manufacturability, and interdependence between the design variables.

20. The method of any of clauses 1 to 19, wherein the cost function is a function of one or more selected from: edge placement error, critical dimension, resist contour distance, worst defect size, and best focus shift.

21. The method of any of clauses 1 to 20, wherein the cost function is minimized by solving polynomials, including higher-order polynomials of the design variables.

22. The method of any of clauses 1 to 21, wherein the design layout comprises an assist feature, and wherein the assist feature comprises a SRAF (Sub Resolution Assist Feature) and/or PRAF (Printable Resolution Assist Feature).

23. A computer program product comprising a computer readable medium having instructions recorded thereon, the instructions when executed by a computer implementing the method of any of the above clauses.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein.

The descriptions above are intended to be illustrative, not limiting. Thus, it will be apparent to one skilled in the art that modifications may be made to the embodiments as described without departing from the scope of the claims set out below.

What is claimed is:

1. A method to improve a lithographic process for imaging a portion of a design layout onto a substrate using a lithographic projection apparatus comprising an illuminator and projection optics, the method comprising:

computing, by a hardware computer device, a multi-variable cost function of a plurality of design variables that are characteristics of the lithographic process, wherein the multi-variable cost function is (i) a function of a first characteristic and a second characteristic of a three-dimensional resist profile on the substrate, the first and second characteristics of the three-dimensional resist profile associated with portions of the three-dimensional resist profile at different distances from the substrate, or (ii) a function of a first characteristic and a second characteristic of a three-dimensional radiation field projected from the projection optics, the first and second characteristics of the three-dimensional radiation field associated with portions of the three-dimensional radiation field at different distances from the substrate, or (iii) both (i) and (ii), wherein the multi-variable cost function is configured to (iv) co-optimize using the first characteristic and the second characteristic of a three-dimensional resist profile or optimize with a geometric or mathematical relationship between the first characteristic and the second characteristic of a three-dimensional resist profile, (v) co-optimize using the first characteristic and the second characteristic of a three-dimensional radiation field or optimize with a geometric or mathematical relationship between the first characteristic and the second characteristic of a three-dimensional radiation field, or (vi) both (iv) and (v); and reconfiguring one or more of the characteristics of the lithographic process by adjusting the design variables until a predefined termination condition is satisfied.

2. The method of claim 1, wherein the first and second characteristics are selected from: MEEF, ILS, edge location, edge placement error, radiation intensity, phase and/or a combination selected therefrom.

3. The method of claim 1, wherein the multi-variable cost function is a function of a difference between the first characteristic and the second characteristic.

4. The method of claim 1, wherein the multi-variable cost function is a function of a characteristic of a cross-section of a resist image along a surface not parallel to the substrate.

5. The method of claim 4, wherein the surface is perpendicular to the substrate.

6. The method of claim 1, wherein the multi-variable cost function is a function of a characteristic of a first aerial image and a characteristic of a second aerial image, wherein the first and second aerial images are not on a same plane.

7. The method of claim 1, wherein the multi-variable cost function is a function of a three-dimensional resist profile on the substrate and further comprising predicting the three-dimensional resist profile using a resist model.

8. The method of claim 1, wherein the reconfiguring comprises redetermining the three-dimensional resist profile, the three-dimensional radiation field, or both, using at least some of the design variables that are characteristics of the design layout and/or an illumination produced by the illuminator and that are adjusted.

9. The method of claim 1, wherein the reconfiguring comprises computing the multi-variable cost function using a projection optics model.

10. The method of claim 1, wherein iterative reconfiguration is performed without constraints or with constraints dictating the range of at least some of the design variables.

11. The method of claim 1, wherein at least some of the design variables are under a constraint representing a physical restriction in a hardware implementation of the lithographic projection apparatus, wherein the constraint includes one or more selected from: a tuning range, a rule governing patterning device manufacturability, and/or interdependence between the design variables.

12. The method of claim 1, wherein the cost function is a function of one or more selected from: edge placement error, critical dimension, resist contour distance, worst defect size, and/or best focus shift.

13. The method of claim 1, wherein the design layout comprises an assist feature, and wherein the assist feature comprises a SRAF (Sub Resolution Assist Feature) and/or PRAF (Printable Resolution Assist Feature).

14. A non-transitory computer program product comprising a computer readable medium having instructions recorded thereon, the instructions when executed by a computer implementing a method to improve a lithographic process for imaging a portion of a design layout onto a substrate using a lithographic projection apparatus comprising an illuminator and projection optics, the method comprising:

computing, by a hardware computer device, a multi-variable cost function of a plurality of design variables that are characteristics of the lithographic process, wherein the multi-variable cost function is (i) a function of a first characteristic and a second characteristic of a three-dimensional resist profile on the substrate, the first and second characteristics of the three-dimensional resist profile associated with portions of the three-dimensional resist profile at different distances from the substrate, or (ii) a function of a first characteristic and a second characteristic of a three-dimensional radiation field projected from the projection optics, the first and second characteristics of the three-dimensional radiation field associated with portions of the three-dimensional radiation field at different distances from the substrate, or (iii) both (i) and (ii), wherein the multi-variable cost function is configured to (iv) co-optimize using the first characteristic and the second characteristic of a three-dimensional resist profile or optimize with a geometric or mathematical relationship between the first characteristic and the second characteristic of a three-dimensional resist profile, (v) co-optimize using the first characteristic and the second characteristic of a three-dimensional radiation field or optimize with a geometric or mathematical relationship between the first characteristic and the second characteristic of a three-dimensional radiation field, or (vi) both (iv) and (v); and reconfiguring one or more of the characteristics of the lithographic process by adjusting the design variables until a predefined termination condition is satisfied.

15. The non-transitory computer program product of claim 14, wherein the first and second characteristics are selected from: MEEF, ILS, edge location, edge placement error, radiation intensity, phase and/or a combination selected therefrom.

16. The non-transitory computer program product of claim 14, wherein the multi-variable cost function is a function of a characteristic of a cross-section of a resist image along a surface not parallel to the substrate.

17. The non-transitory computer program product of claim 14, wherein the multi-variable cost function is a function of a characteristic of a first aerial image and a characteristic of a second aerial image, wherein the first and second aerial images are not on a same plane.

18. The non-transitory computer program product of claim 14, wherein the cost function is a function of one or more selected from: edge placement error, critical dimension, resist contour distance, worst defect size, and/or best focus shift.

19. The non-transitory computer program product of claim 14, wherein the multi-variable cost function is a function of a three-dimensional resist profile on the substrate and the method further comprises predicting the three-dimensional resist profile using a resist model.

20. The non-transitory computer program product of claim 14, wherein the reconfiguring comprises redetermining the three-dimensional resist profile, the three-dimensional radiation field, or both, using at least some of the design variables that are characteristics of the design layout and/or a illumination produced by the illuminator and that are adjusted.

\* \* \* \* \*